(12) United States Patent
Song et al.

(10) Patent No.: US 8,161,361 B1
(45) Date of Patent: Apr. 17, 2012

(54) AVERAGING SIGNALS TO IMPROVE SIGNAL INTERPRETATION

(75) Inventors: Hongxin Song, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1635 days.

(21) Appl. No.: 10/600,419

(22) Filed: Jun. 20, 2003

Related U.S. Application Data

(60) Provisional application No. 60/443,341, filed on Jan. 28, 2003, provisional application No. 60/458,359, filed on Mar. 27, 2003.

(51) Int. Cl.
*H03M 13/03* (2006.01)

(52) U.S. Cl. ............ 714/795; 714/822; 375/76; 375/94; 360/67; 360/74.4

(58) Field of Classification Search .............. 360/39–54, 360/67, 74.4; 375/76, 94; 714/822
See application file for complete search history.

(56) References Cited

U.S. PATENT DOCUMENTS

| | | | | |
|---|---|---|---|---|
| 5,081,547 A | * | 1/1992 | Howell ............................ | 360/31 |
| 5,255,136 A | | 10/1993 | Machado et al. | |
| 5,291,198 A | | 3/1994 | Dingwall et al. | |
| 5,329,554 A | * | 7/1994 | Behrens et al. ............... | 375/340 |
| 5,610,776 A | | 3/1997 | Oh | |
| 6,009,549 A | * | 12/1999 | Bliss et al. .................... | 714/769 |
| 6,038,091 A | | 3/2000 | Reed et al. | |
| 6,151,179 A | | 11/2000 | Poss | |
| 6,163,517 A | * | 12/2000 | Kim et al. ................... | 369/59.21 |
| 6,384,999 B1 | | 5/2002 | Schibilla | |
| 6,424,476 B1 | | 7/2002 | Matsubara et al. | |
| 6,493,165 B1 | | 12/2002 | Satoh et al. | |
| 6,519,715 B1 | * | 2/2003 | Takashi et al. .................. | 714/32 |
| 7,050,252 B1 | * | 5/2006 | Vallis .............................. | 360/53 |
| 7,136,244 B1 | * | 11/2006 | Rothberg ........................ | 360/53 |
| 7,843,660 B1 | * | 11/2010 | Yeo ................................. | 360/53 |
| 2003/0147168 A1 | * | 8/2003 | Galbraith et al. ............... | 360/53 |

FOREIGN PATENT DOCUMENTS

EP  1 271 509 A1  1/2003

OTHER PUBLICATIONS

Hansen, W., "Hard Disk Drives" Feb. 1999, IEEE, Southern Minnesota Section Newsletter.
Pai, P., "Equalization & Clock Recovery in Magnetic Storage Read Channels," a dissertation, Dec. 1996, UCLA, Electrical Engineering Department.

* cited by examiner

*Primary Examiner* — Sam Rizk

(57) ABSTRACT

Systems and techniques to interpret signals on a noisy channel. In general, in one implementation, the technique includes: interpreting an input signal as discrete values, and in response to an inadequate signal, averaging multiple signals to improve interpretation of the input signal. The input signal can be a read signal from a storage medium, such as those found in disk drives. A read channel can include a buffer and an averaging circuit capable of different signal averaging approaches in a retry mode, including making signal averaging decisions based on a signal quality measure. Buffering read signals can be done in alternative locations in the read channel and can involve buffering of many prior read signals and/or buffering of an averaged read signal.

67 Claims, 3 Drawing Sheets

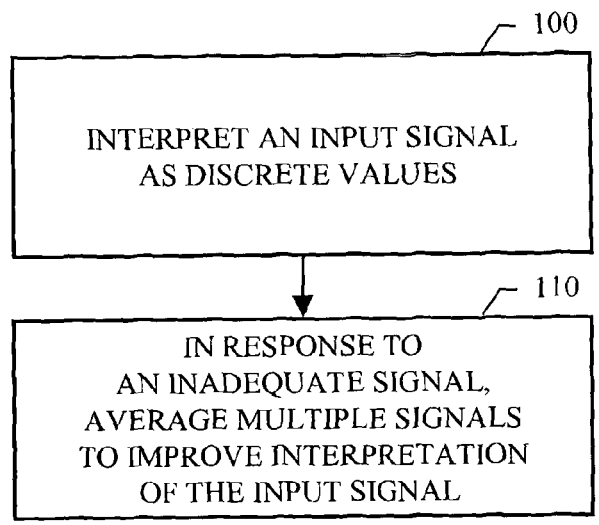
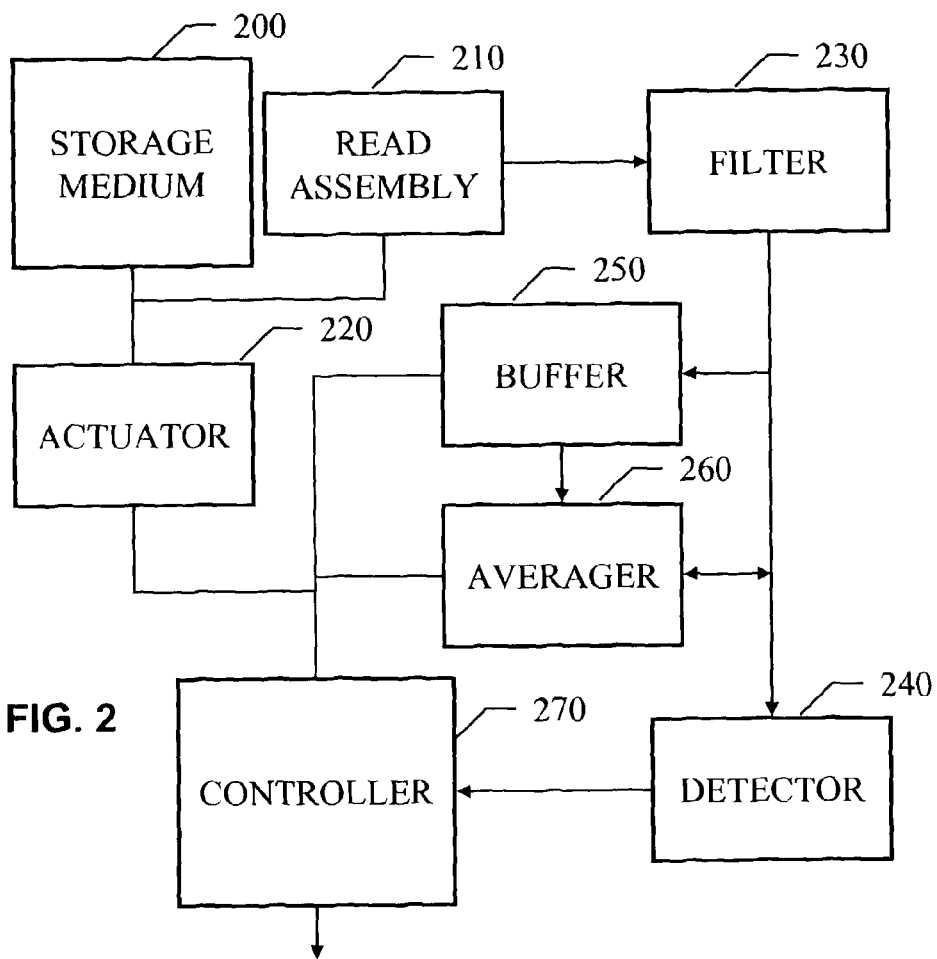

AVERAGING SIGNALS TO IMPROVE SIGNAL INTERPRETATION

CROSS REFERENCE TO RELATED APPLICATIONS

This application claims the benefit of the priority of U.S. Provisional Application Ser. No. 60/443,341, filed Jan. 28, 2003 and entitled "Improvement The Performance in Retry Mode"; and this application claims the benefit of the priority of U.S. Provisional Application Ser. No. 60/458,359, filed Mar. 27, 2003 and entitled "Improvement The Performance in Retry Mode".

TECHNICAL FIELD

The present disclosure describes systems and techniques relating to signal processing, for example, interpreting read signals obtained from a magnetic storage medium.

BACKGROUND

Signal processing circuits are frequently used to read storage media and interpret obtained analog signals as discrete values stored on the media. Analog signal are often obtained from magnetic storage media. A transducer head may fly on a cushion of air over a magnetic disk surface. The transducer converts magnetic field variations into an analog electrical signal. The analog signal is amplified, converted to a digital signal and interpreted (e.g., using maximum likelihood techniques, such as using a Viterbi decoder). Tracking of stored data during a read operation is frequently performed using feedback or decision aided gain and timing control.

Increasing the amount of data stored on a magnetic medium can result in an increased error-rate unless error detection and correction techniques are used to compensate. If a read signal from a unit of storage (e.g., a cluster or a sector) on a disk cannot be interpreted adequately, typically the storage unit is read again one or more times to obtain a signal that can be interpreted, or to determine that there is a disk error.

SUMMARY

The present disclosure includes systems and techniques relating to interpreting signals on a noisy channel. According to an aspect, an input signal can be interpreted as discrete values. In response to an inadequate signal, multiple signals can be averaged to improve interpretation of the input signal. The input signal can be a read signal from a storage medium, such as those found in disk drives. A read channel can include a buffer and an averaging circuit capable of different signal averaging approaches in a retry mode, including making signal averaging decisions based on a signal quality measure. Buffering read signals can be done in alternative locations in the read channel and can involve buffering of many prior read signals and/or buffering of an averaged read signal.

Averaging read signals in a retry mode, such as by averaging sampled digital signals, can result in reduced signal variance and noise. Many different sources of noise can be addressed, including noise created by an off-track (OT) condition in a hard drive. When using these techniques to obtain the desired signal, higher signal to noise ratios (SNR) can be achieved and storage devices with greater storage capacity can be created. The systems and techniques described here can be combined with various signal processing and error detection and correction techniques, including techniques applied to signal detector output to address noise issues.

Details of one or more implementations are set forth in the accompanying drawings and the description below. Other features, objects and advantages may be apparent from the description and drawings, and from the claims.

DRAWING DESCRIPTIONS

FIG. 1 is a flowchart illustrating signal averaging in response to an inadequate signal.

FIG. 2 is a block diagram showing a storage device that uses signal averaging.

Like reference symbols in the various drawings indicate like elements.

DETAILED DESCRIPTION

Figure 3:
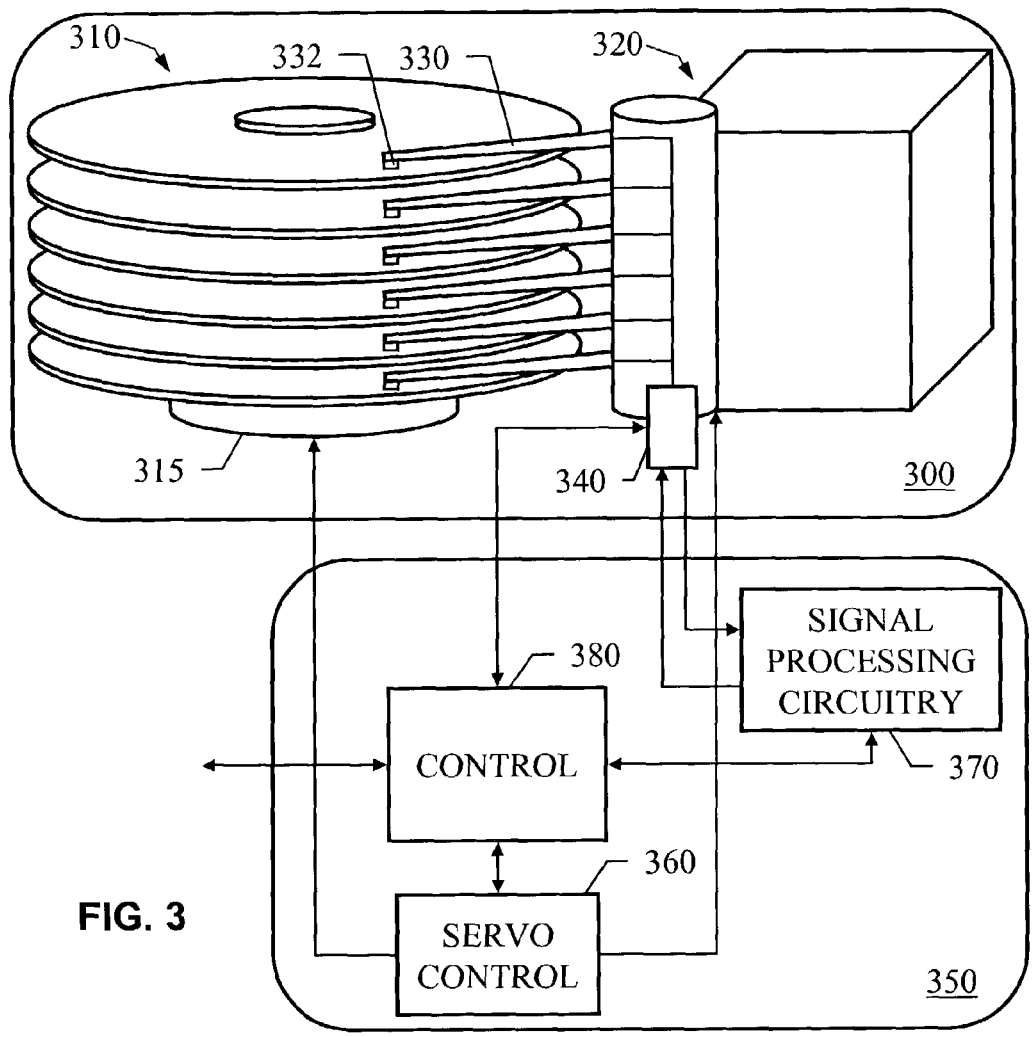
FIG. 3 shows a magnetic-media disk drive that uses signal averaging in a retry mode.

FIG. 1 is a flowchart illustrating signal averaging in response to an inadequate signal. An input signal can be from any channel or media. The input signal is interpreted as discrete values at 100. The input signal generally includes noise, and interpreting this signal involves finding the desired signal (without noise) in the input signal. When the desired signal cannot be determined from the input signal with sufficient certainty, the input signal can be considered inadequate or ambiguous. The level of certainty needed for an input signal can depend on the channel/media, the signal detection techniques, and any post-processing techniques used.

The input signal is a waveform x(t) that represents the result of reading data on a channel or media. The waveform generally includes the desired signal s(t) and noise n(t). The noise n(t) can be additive white noise. Other types of noise can be present in the waveform x(t) as well, such as media noise m(t), which is generally correlated and data dependent, corresponding to a medium being read.

As the waveform x(t) is interpreted, a determination is made as to whether the input signal adequately indicates the discrete values. When there is excessive noise in the input signal, the signal can be rejected as inadequate. In response to an inadequate signal, multiple signals are averaged to improve interpretation of the input signal at 110. For example, when an input signal has too much noise, a new signal can be obtained for the same data, the two obtained signals can be averaged together, and the averaged signal can be interpreted as discrete values.

Newly obtained signals for the same data have the same desired signal s(t) but a different noise component n(t). Thus, in a data storage implementation, the first input signal can be defined as:

$$x_1(t)=s(t)+m(t)+n_1(t), \qquad (1)$$

and the second input signal can be defined as:

$$x_2(t)=s(t)+m(t)+n_2(t), \qquad (2)$$

where $x_i(t)(=1, 2)$ is the readback waveform, s(t) is the desired signal, m(t) is the media noise, and $n_i(t)(i=1, 2)$ is the random noise. Taking the average of $x_1(t)$ and $x_2(t)$, gives:

$$\bar{x}(t) = \frac{1}{2}[x_1(t) + x_2(t)] = s(t) + m(t) + \frac{1}{2}[n_1(t) + n_2(t)]. \quad (3)$$

Let $$\bar{n}(t) = \frac{1}{2}[n_1(t) + n_2(t)],$$

then the variance $$\sigma_{\bar{n}}^2 = \frac{1}{2}\sigma_n^2.$$

Assuming that additive white noise makes one third of total noise power, then $\bar{x}(t)$ can provide 0.79 dB gain over either $x_1(t)$ or $x_2(t)$.

The averaging can be performed in a retry mode when a first attempt to read specific data on a channel or media has failed. In the retry mode, a new read is performed. The decision of whether the discrete values are adequately indicated in the retry mode can be based on just the averaged signal $\bar{x}(t)$, which can be the average of all the i read attempts or the average of the last q read attempts (e.g., q=3). The decision of whether the discrete values are adequately indicated in the retry mode can be based on both the averaged signal $\bar{x}(t)$ and the most recent signal $x_i(t)$. For example, if the hard decisions based on $x_i(t)$ and $\bar{x}(t)$ differ; this can be used as an indication of an error.

FIG. 2 is a block diagram showing a storage device that uses signal averaging. The storage device includes a storage medium 200, which can be read-only or read/write media and can be magnetic-based, optical-based, semiconductor-based media, or a combination of these. Examples of the storage medium 200 include hard disk platters in a hard disk drive, a floppy disk, a tape, and an optical disc (e.g., laser disk, compact disc, digital versatile disk).

The storage device includes a read assembly 210 that reads the storage media 200 under the control of an actuator 220 (e.g., a servo). A read signal is generated and provided to a filter 230. The filter 230 can convert the input signal from analog to digital and/or equalize the input signal. The result can then be provided to a detector 240. A peak-detection system can be used, and various amplifiers, automatic gain control (AGC), and threshold detection circuits can also be used. Partial-response equalization can be combined with maximum-likelihood sequence detection (PRML), using either a discrete-time approach or a continuous-time approach (e.g., the class-IV partial response target (PR-IV)). Moreover, timing control circuitry can be used to regulate the filtered signal provided to the detector 240.

The filtered signal is also provided to a buffer 250 that stores input signals for later use. The output of the detector 240 is provided to a controller 270 that controls read operations in the storage device. If a read signal is inadequate, the controller 270 can enter the device into a retry mode where the same data is read again. This later read signal for the data is averaged with the read signal stored in the buffer 250, using an averager 260, and the result is supplied to the detector 240.

Averaging of signals can be performed at many different points in a retry mode. A new read signal can be obtained after each failure to detect an adequate signal. Adequate signal detection can be based on an average signal composed of the most recent read signals averaged together (e.g., the last two or three read signals averaged together). Alternatively, a running average of all past read signals can be maintained, and each new read signal can be averaged with the stored averaged read signal before detection.

Determining whether the discrete-values are adequately indicated can involve comparing interpretations of the averaged read signal and a current read signal. If the discrete values indicated by the averaged signal differ from values indicated by the current read signal, this can be used as an indication of an error. This error indication can be provided to error correction circuitry for further processing.

A quality monitor can be used to measure signal quality for use in reading the data. The quality measure can be based on a defined signal characteristic. Averaging can be based on the quality measure, such as by excluding a read signal with a low quality measure from the averaging, or such as by performing weighted averaging, where the weights are given by the quality measure.

A Viterbi detector and an error correction circuit (ECC) can be used. The ECC can be used to correct errors and to determine read signal quality based on a Viterbi metric. The averaging circuit can have a quality measure as an input to determine if a particular read signal should be kept (e.g., include or exclude samples based on the Viterbi metric).

The signal averaging systems and techniques described here can be combined with various signal processing and error detection and correction techniques. For example, in a storage device, bit-error-rate (BER) improvements obtained by averaging signals can be carried through a post-processor, such as a media noise processor (MNP), that processes detector output.

FIG. 3 shows a magnetic-media disk drive that uses signal averaging in a retry mode. The disk drive includes a head-disk assembly (HDA) 300 and drive electronics 350 (e.g., a printed circuit board (PCB) with semiconductor devices). The HDA 300 includes several disks 310 mounted on an integrated spindle and motor assembly 315. The motor assembly 315 rotates the disks 310 under read-write heads connected with a head assembly 320 in the HDA 300. The disks 310 can be coated with a magnetically hard material (e.g., a particulate surface or a thin-film surface) and can be written to or read from a single side or both sides of each disk.

A head 332 on an arm 330 can be positioned as needed to read data on the disk. A motor (e.g., a voice coil motor or a stepper motor) can be used to position the heads over the desired track(s). The arm 330 can be a pivoting or sliding arm and can be spring-loaded to maintain a proper flying height for the head 332 in any drive orientation. A closed-loop head positioning system can be used.

The HDA 300 can include a read-write chip 340 where head selection and sense current value(s) can be set. The read-write chip 340 can amplify a read signal before outputting it to signal processing circuitry 370. The signal processing circuitry 370 can include a read signal circuit, a servo signal processing circuit, and a write signal circuit.

Signals between the HDA 300 and the drive electronics 350 can be carried through a flexible printed cable. A controller 380 can direct a servo controller 360 to control mechanical operations, such as head positioning through the head assembly 320 and rotational speed control through the motor assembly 315. The controller 380 can be one or more integrated circuit (IC) chips (e.g., a combo chip). The controller 380 can be a microprocessor and a hard disk controller. The drive electronics 350 can also include various interfaces, such as a host-bus interface, and memory devices, such as a read only memory (ROM) for use by microprocessor, and a random access memory (RAM) for use by a hard disk controller. The hard disk controller can include error correction circuitry.

The HDA 300 and drive electronics 350 can be closed in a sealed container with an integral air filter. For example, the hard disk drive can be assembled using a Winchester assembly. The rotating platter can be driven by a brush-less DC motor, and the rotational frequency can be accurately servo-locked to a crystal reference.

Figure 4:
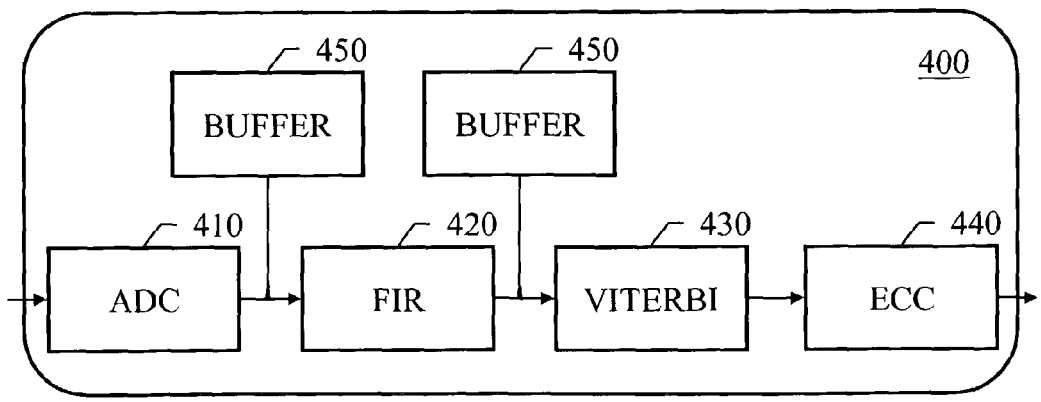
FIG. 4 shows a signal processing apparatus that can implement a signal averaging retry mode in a storage device.

FIG. 4 shows a signal processing apparatus 400 that can implement a signal averaging retry mode in a storage device. The apparatus 400 includes a read channel, which can be implemented as one or more devices (e.g., one or more IC devices) in a storage device. An input signal is provided to an ADC 410. The input signal may be an amplified signal (e.g., a read signal amplified both by a pre-amplifier and a variable-gain amplifier (VGA), which can be regulated by an AGC). The input signal can also be at least partially equalized, such as by using a programmable continuous-time filter before the ADC 410.

The ADC 410 converts the analog input to digital output. The ADC 410 can be a 6-bit ADC. The output of the ADC 410 can be provided to a finite impulse response (FIR) digital filter 420, which shapes the signal to the target used by a Viterbi detector 430. The FIR 420 can be a 9-tap FIR, and can be programmable or adaptive.

Errors in sampling phase can be sensed, and the phase can be corrected using a phase locked loop (PLL). The equalized signal is provided to the Viterbi detector 430, which decodes the waveform to find the true signal. An ECC 440 can be used to identify errors and correct them when possible.

The averaging operation can be performed after analog to digital conversion or after digital equalization to the same effect. Thus, a buffer 450 can be placed in the read channel after analog to digital conversion (e.g., after the ADC 410) or after digital equalization (e.g., after the FIR 420). The buffer 450 is shown in both positions in FIG. 4 for illustration. In general, placing the buffer 450 after the ADC 410 instead of the FIR 420 can result in reduced memory requirements (e.g., a reduced bit width for storage of the signal). Any number of storage units can be buffered (e.g., buffering can be done one disk sector at a time), depending on a given storage device and the nature of the retry mode operations to be implemented.

Figure 5:
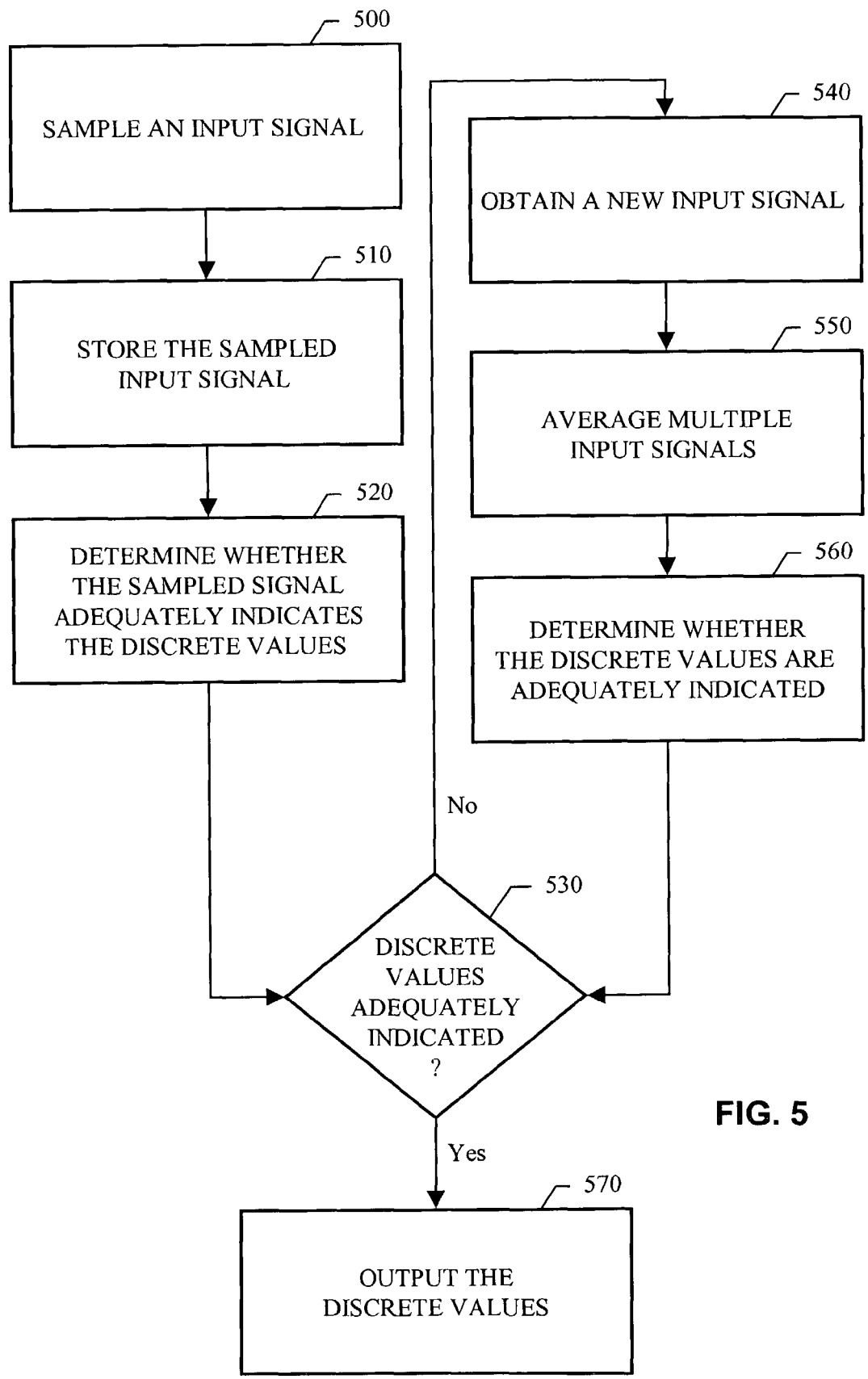
FIG. 5 is a flowchart illustrating signal averaging in a retry mode.

FIG. 5 is a flowchart illustrating signal averaging in a retry mode. An input signal can be sampled at 500. Sampling the input signal can involve converting the input signal to a digital signal and filtering the digital signal based on finite impulse response. The sampled input signal can be stored at 510. Then, discrete values can be detected in the sampled input signal at 520. A determination can be made as to whether the sampled signal adequately indicates the discrete values.

If the discrete values are adequately indicated at 530, the discrete values can be output at 570. If the discrete values are not adequately indicated, a retry mode can be entered. A new input signal can be obtained at 540. Multiple input signals are averaged at 550. Then, a determination can be made as to whether the discrete values are adequately indicated based on the averaged signal at 560.

The signals that are averaged can vary. In a storage device, the data portion (e.g., the portion right after a sync mark) of the ADC output of the two read back waveforms can be averaged. When new signals are repeatedly obtained in the retry mode, the most recent X signals can be averaged (e.g., the most recent three signals), or a current signal can be averaged with a stored average of all previous obtained signals. Moreover, obtained signals can be excluded from the averaging based on a signal quality metric, such as described above.

Determining whether the discrete values are adequately indicated based on the averaged signal can involve different types of comparisons. The averaged signal can be interpreted directly, and the determination can be based solely on the interpreted averaged signal. Alternatively, the determination can involve a comparison of interpretations of the averaged signal and of the current signal. For example, hard decisions from $x_2(t)$ and $\bar{x}(t)$ can be compared after run length limited (RLL) decoding, and erasures can be marked wherever there is discrepancy; these erasures can be provided to an ECC for further processing.

A few embodiments have been described in detail above, and various modifications are possible. Thus, other embodiments may be within the scope of the following claims.

What is claimed is:

1. A signal processing apparatus comprising:
    an input to receive a signal, wherein the signal from the input comprises an analog signal;
    an analog-to-digital converter (ADC) to convert the analog signal to a digital signal;
    a buffer responsive to the ADC to store the digital signal;
    a filter in communication with the ADC to produce a filtered digital signal based on the digital signal;
    a detector responsive to the filter to interpret the filtered digital signal as discrete values;
    an averaging circuit in communication with the buffer and the detector to cause interpretation, by the detector during a retry mode, of a new signal comprising an average that is determined responsive to a group of signals, the group of signals comprising one or more previous signals stored in the buffer and a current signal;
    a control circuit that determines whether the discrete values are adequately indicated based on output of the detector, that initiates the retry mode when the discrete values are not adequately indicated, and that determines whether the discrete values are adequately indicated from the interpretation of the new signal in the retry mode based on a measurement of differences between hard decisions indicated by the new signal and hard decisions indicated by the current signal; and
    an error correction circuit in communication with the detector and the averaging circuit to provide a signal quality metric that is based on output of the detector, wherein the control circuit uses the signal quality metric to selectively exclude a signal of the group of signals from the average.

2. The apparatus of claim 1, wherein the signal from the input comprises a read signal received from a storage medium.

3. The apparatus of claim 1, wherein the buffer is coupled between the ADC and the filter.

4. The apparatus of claim 1, wherein the buffer is coupled between the filter and the detector.

5. The apparatus of claim 1, wherein the filter comprises a finite impulse response (FIR) digital filter.

6. The apparatus of claim 1, wherein the detector comprises a Viterbi detector.

7. A signal processing apparatus, comprising:
    an input to receive a signal, wherein the signal from the input comprises an analog signal;
    an analog-to-digital converter (ADC) to convert the analog signal to a digital signal;
    a buffer responsive to the ADC to store the digital signal;
    a filter in communication with the ADC to produce a filtered digital signal based on the digital signal;
    a detector responsive to the filter to interpret the filtered digital signal as discrete values;

an averaging circuit in communication with the buffer and the detector to cause interpretation, by the detector during a retry mode, of an averaged signal comprising a weighted average of one or more previous signals stored in the buffer and a current signal; and a control circuit that determines whether the discrete values are adequately indicated based on output of the detector, that initiates the retry mode when the discrete values are not adequately indicated, and that determines whether the discrete values are adequately indicated from the interpretation of the averaged signal in the retry mode, wherein the control circuit determines whether the discrete values are adequately indicated based on comparison of interpretations of the averaged signal and the current signal, wherein the averaging circuit determines the weighted average based on weights respectively associated with the one or more previous signals and the current signal, wherein the weights are based on respective signal quality measures, and wherein the signal quality measures are based on output of the detector.

8. The apparatus of claim 7, wherein the control circuit causes averaging of a defined number of most recent input signals, wherein the defined number is greater than two.

9. The apparatus of claim 7, wherein the buffer is coupled between the ADC and the filter.

10. The apparatus of claim 7, wherein the buffer is coupled between the filter and the detector.

11. A storage device, comprising:
a storage medium;
a head assembly operable to generate an analog read signal from the storage medium;
an analog-to-digital converter (ADC) to convert the analog read signal to a digital read signal;
a buffer that saves the digital read signal;
a filter in communication with the ADC to produce a filtered digital read signal based on the digital read signal;
a detector that interprets the filtered digital read signal as discrete values;
an averaging circuit in communication with the buffer and the detector;
a control circuit in communication with the averaging circuit to determine whether the discrete values are adequately indicated based on output of the detector, initiate a retry mode when the discrete values are not adequately indicated, cause interpretation by the detector in the retry mode of a new read signal comprising an average that is determined responsive to a group of signals, the group of signals comprising one or more previous signals stored in the buffer and a current read signal, and determine whether the discrete values are adequately indicated from the interpretation of the new read signal in the retry mode based on a measurement of differences between hard decisions indicated by the new signal and hard decisions indicated by the current signal; and
an error correction circuit in communication with the detector and the averaging circuit to provide a signal quality metric that is based on output of the detector, wherein the control circuit uses the signal quality metric to selectively exclude a signal of the group of signals from the average.

12. The storage device of claim 11, wherein the buffer is coupled between the ADC and the filter.

13. The storage device of claim 11, wherein the buffer is coupled between the filter and the detector.

14. The storage device of claim 11, wherein the filter comprises a finite impulse response (FIR) digital filter.

15. The storage device of claim 11, wherein the detector comprises a Viterbi detector.

16. A storage device, comprising:
a storage medium;
a head assembly operable to generate an analog read signal from the storage medium;
an analog-to-digital converter (ADC) to convert the analog read signal to a digital read signal;
a buffer that saves the digital read signal;
a filter in communication with the ADC to produce a filtered digital read signal based on the digital read signal;
a detector that interprets the filtered digital read signal as discrete values;
an averaging circuit in communication with the buffer and the detector; and
a control circuit in communication with the averaging circuit to determine whether the discrete values are adequately indicated based on output of the detector, initiate a retry mode when the discrete values are not adequately indicated, cause interpretation by the detector in the retry mode of an averaged read signal comprising a weighted average of one or more previous read signals stored in the buffer and a current read signal, and determine whether the discrete values are adequately indicated from the interpretation of the averaged signal in the retry mode,
wherein the averaging circuit determines the weighted average based on weights respectively associated with the one or more previous signals and the current signal, wherein the weights are based on respective signal quality measures, and wherein the signal quality measures are based on output of the detector.

17. The storage device of claim 16, wherein the control circuit causes averaging of a defined number of most recent read signals, wherein the defined number is greater than two.

18. The storage device of claim 16, wherein the buffer is coupled between the ADC and the filter.

19. The storage device of claim 16, wherein the buffer is coupled between the filter and the detector.

20. A method of reading data on a channel or media, the method comprising:
interpreting an input signal as discrete values;
deciding whether the discrete values have been adequately interpreted from the input signal;
entering a retry mode in response to a decision that the discrete values have not been adequately interpreted from the input signal;
obtaining, in the retry mode, second signals representing same data as the input signal;
obtaining signal quality metrics corresponding to the second signals and the input signal;
averaging, in the retry mode, multiple signals to produce an averaged signal to improve interpretation of the input signal, the multiple signals including at least two or more of the input signal and the second signals, wherein the averaging comprises using the signal quality metrics to selectively exclude a respective signal from the averaged signal;
interpreting the averaged signal as new discrete values; and
determining whether the new discrete values are adequately indicated.

21. The method of claim 20, wherein interpreting the input signal comprises:
sampling the input signal;
storing the sampled input signal; and
detecting the discrete values in the sampled input signal.

22. The method of claim 21, wherein sampling the input signal comprises converting the input signal to a digital signal, storing the sampled input signal comprises storing the digital signal, and the multiple signals to be averaged include the stored digital signal.

23. The method of claim 21, wherein sampling the input signal comprises converting the input signal to a digital signal and filtering the digital signal based on finite impulse response, storing the sampled input signal comprises storing the filtered digital signal, and the multiple signals to be averaged include the stored and filtered digital signal.

24. The method of claim 20, wherein the input signal comprises a read signal received from a storage medium, interpreting the input signal comprises determining if the read signal adequately indicates the discrete values, and averaging the multiple signals comprises averaging multiple read signals of the storage medium to improve read signal interpretation.

25. The method of claim 20, wherein determining whether the discrete values are adequately indicated comprises interpreting the averaged signal with a Viterbi detector.

26. The method of claim 20, wherein averaging the multiple signals further comprises, in the retry mode, in response to the discrete values being inadequately indicated, repeatedly obtaining a new signal, averaging the new signal with the previous averaged signal, and determining if the newly averaged signal adequately indicates the discrete values.

27. A method of reading data on a channel or media, the method comprising:
  interpreting an input signal as discrete values;
  deciding whether the discrete values have been adequately interpreted from the input signal;
  entering a retry mode in response to a decision that the discrete values have not been adequately interpreted from the input signal;
  obtaining, in the retry mode, one or more second signals representing same data as the input signal;
  averaging, in the retry mode, multiple signals to improve interpretation of the input signal, wherein the averaging includes determining a weighted average based on weights, the input signal, and the one or more second signals to produce an averaged signal, wherein the weights correspond, respectively, to the input signal and the one or more second signals, wherein the weights are based on respective signal quality measures;
  interpreting the averaged signal as new discrete values; and
  determining whether the new discrete values are adequately indicated, wherein determining whether the new discrete values are adequately indicated comprises comparing interpretations of the averaged signal and of the one or more second signals.

28. The method of claim 27, wherein averaging the multiple signals further comprises, in the retry mode, in response to the discrete values being inadequately indicated, repeatedly obtaining a new signal, averaging most recent signals to generate a newly averaged signal, and determining if the newly averaged signal adequately indicates the discrete values.

29. The method of claim 28, wherein averaging the most recent signals comprises averaging the three most recent signals.

30. A system comprising:
  means for storing data; and
  means for reading the data, said means for reading including:
  means for interpreting an input signal as discrete values;
  means for deciding whether the discrete values have been adequately interpreted from the input signal;
  means for entering a retry mode in response to a decision that the discrete values have not been adequately interpreted from the input signal; and
  means for averaging, in the retry mode, multiple read signals to produce an averaged signal to improve signal interpretation, the means for averaging including:
  means for obtaining second signals representing same data as the input signal, the multiple read signals including at least two or more of: the input signal and the second signals,
  means for obtaining signal quality metrics corresponding to the second signals and the input signal,
  means for using the signal quality metrics to selectively exclude a respective signal from the averaged signal,
  means for interpreting the averaged signal as new discrete values, and
  means for determining whether the new discrete values are adequately indicated;
  wherein the means for reading further includes error-detection means for controlling which read signals are averaged.

31. The system of claim 30, wherein the means for storing data comprises magnetic means for storing data.

32. The system of claim 30, wherein the means for averaging comprises means for saving a digital read signal before equalization in a read channel.

33. The system of claim 32, wherein the means for saving a digital read signal comprises means for saving an averaged read signal.

34. The system of claim 30, wherein the means for reading further includes means for converting the read signals to digital signals, means for filtering the digital signals, and means for detecting stored information in the filtered digital signals.

35. The system of claim 34, wherein the means for averaging comprises means for storing a read signal between the means for converting and the means for filtering.

36. The system of claim 34, wherein the means for averaging comprises means for storing a read signal between the means for filtering and the means for detecting.

37. The system of claim 34, wherein the means for detecting comprises Viterbi means for detecting stored information in the filtered digital signals.

38. A system comprising:
  means for storing data; and
  means for reading the data, said means for reading including:
  means for interpreting an input signal as discrete values;
  means for deciding whether the discrete values have been adequately interpreted from the input signal;
  means for entering a retry mode in response to a decision that the discrete values have not been adequately interpreted from the input signal; and
  means for averaging, in the retry mode, multiple read signals to produce an averaged signal to improve signal interpretation, the means for averaging including:
  means for obtaining one or more second signals representing same data as the input signal,
  means for determining a weighted average based on weights, the input signal, and the one or more second signals to produce an averaged signal, wherein the weights correspond, respectively, to the input signal and the one or more second signals, wherein the weights are based on respective signal quality measures, means for interpreting the averaged signal as new discrete values, and means for determining whether the new discrete values are adequately indicated;

wherein the means for reading further includes means for comparing an averaged read signal and a current read signal.

39. The system of claim 38, wherein the means for averaging comprises means for averaging three or more most recent read signals.

40. An article comprising:

means for interpreting an input signal as discrete values;

means for deciding whether the discrete values have been adequately interpreted from the input signal;

means for entering a retry mode in response to a decision that the discrete values have not been adequately interpreted from the input signal; and means for averaging, in the retry mode, multiple read signals to produce an averaged signal to improve signal interpretation, the means for averaging including:

means for obtaining second signals representing same data as the input signal, the multiple read signals including at least two or more of: the input signal and the second signals, means for obtaining signal quality metrics corresponding to the second signals and the input signal, means for using the signal quality metrics to selectively exclude a respective signal from the averaged signal, means for interpreting the averaged signal as new discrete values, and means for determining whether the discrete values are adequately indicated.

41. The article of claim 40, wherein the means for interpreting the input signal comprises:

means for sampling the input signal;

means for storing the sampled input signal; and means for detecting the discrete values in the sampled input signal.

42. The article of claim 41, wherein the means for sampling comprises means for converting the input signal to a digital signal, and the means for storing comprises means for storing the digital signal, and the means for averaging comprises means for averaging the stored digital signal and a current signal.

43. The article of claim 41, wherein the means for sampling comprises means for converting the input signal to a digital signal and means for filtering the digital signal based on finite impulse response, and the means for storing comprises means for storing the filtered digital signal, and the means for averaging comprises means for averaging the stored and filtered digital signal and a current signal.

44. The article of claim 40, wherein the means for determining comprises Viterbi means for interpreting the averaged signal.

45. The article of claim 40, wherein the means for averaging the multiple signals further comprise means for, in the retry mode, in response to the discrete values being inadequately indicated, repeatedly obtaining a new signal, averaging the new signal with the previous averaged signal, and determining if the newly averaged signal adequately indicates the discrete values.

46. An article comprising:

means for interpreting an input signal as discrete values;

means for deciding whether the discrete values have been adequately interpreted from the input signal;

means for entering a retry mode in response to a decision that the discrete values have not been adequately interpreted from the input signal; and means for averaging, in the retry mode, multiple read signals to produce an averaged signal to improve signal interpretation, the means for averaging including:

means for obtaining one or more second signals representing same data as the input signal, means for determining a weighted average based on weights, the input signal, and the one or more second signals to produce an averaged signal, wherein the weights correspond, respectively, to the input signal and the one or more second signals, wherein the weights are based on respective signal quality measures, means for interpreting the averaged signal as new discrete values, and means for determining whether the new discrete values are adequately indicated, wherein the means for determining comprises means for comparing interpretations of the averaged signal and of the second signal.

47. The article of claim 46, wherein the means for averaging the multiple signals further comprise means for, in the retry mode, in response to the discrete values being inadequately indicated, repeatedly obtaining a new signal, averaging most recent signals to generate a newly averaged signal, and determining if the newly averaged signal adequately indicates the discrete values.

48. The article of claim 47, wherein the means for averaging the most recent signals comprises means for averaging the three most recent signals.

49. An apparatus comprising:

means for receiving a signal, wherein the signal comprises an analog signal;

means for converting the analog signal to a digital signal;

means for storing the digital signal;

means for filtering the digital signal;

means for interpreting the filtered digital signal as discrete values;

retry-mode means for interpreting a new signal comprising an average that is determined responsive to a group of signals, the group of signals comprising one or more stored signals and a current signal;

means for determining whether the discrete values are adequately indicated based on output of the means for interpreting, initiating the retry-mode means when the discrete values are not adequately indicated, and determining whether the discrete values are adequately indicated from the interpretation of the new signal by the retry-mode means based on a measurement of differences between hard decisions indicated by the new signal and hard decisions indicated by the current signal;

means for providing a signal quality metric that governs which signals are averaged; and means for using the signal quality metric to selectively exclude the corresponding signal from the average.

50. The apparatus of claim 49, wherein the means for receiving comprises means for receiving a read signal from a storage medium.

51. The apparatus of claim 49, wherein the means for storing comprises means for buffering the digital signal.

52. The apparatus of claim 49, wherein the means for storing comprises means for buffering the filtered digital signal.

53. The apparatus of claim 49, wherein the means for filtering comprises a finite impulse response (FIR) digital filter.

54. The apparatus of claim 49, wherein the retry-mode means for interpreting comprises a Viterbi detector.

55. The apparatus of claim 49, further comprising means for causing the stored signal to be an averaged input signal when two or more signals are obtained in a retry mode.

56. An apparatus comprising:
 means for receiving a signal, wherein the signal comprises an analog signal;
 means for converting the analog signal to a digital signal;
 means for filtering the digital signal;
 means for interpreting the filtered digital signal as discrete values;
 retry-mode means for interpreting an averaged signal that is based on a weighted average of one or more stored signals and a current signal, wherein the weighted average is determined based on weights respectively associated with the one or more stored signals and the current signal, wherein the weights are based on respective signal quality measures; and
 means for determining whether the discrete values are adequately indicated based on output of the means for interpreting, initiating the retry-mode means when the discrete values are not adequately indicated, and determining whether the discrete values are adequately indicated from the interpretation of the averaged signal by the retry-mode means;
 wherein the means for determining comprises means for determining whether the discrete values are adequately indicated based on comparison of interpretations of the averaged signal and the current signal.

57. The apparatus of claim 56, further comprising means for averaging a defined number of most recent input signals, wherein the defined number is greater than two.

58. A non-transitory machine-readable medium embodying information indicative of instructions for causing one or more machines to perform operations for reading data on a channel or media, the operations comprising:
 interpreting an input signal as discrete values;
 deciding whether the discrete values have been adequately interpreted from the input signal;
 entering a retry mode in response to a decision that the discrete values have not been adequately interpreted from the input signal; and
 obtaining, in the retry mode, second signals representing same data as the input signal;
 obtaining signal quality metrics corresponding to the second signals and the input signal;
 averaging, in the retry mode, multiple signals to produce an averaged signal to improve interpretation of the input signal, the multiple signals including at least two or more of the input signal and the second signals, wherein the averaging comprises using the signal quality metrics to selectively exclude a respective signal from the averaged signal;
 interpreting the averaged signal as new discrete values; and
 determining whether the new discrete values are adequately indicated.

59. The machine-readable medium of claim 58, wherein interpreting the input signal comprises:
 sampling the input signal;
 storing the sampled input signal; and
 detecting the discrete values in the sampled input signal.

60. The machine-readable medium of claim 59, wherein sampling the input signal comprises converting the input signal to a digital signal, storing the sampled input signal comprises storing the digital signal, and the multiple signals to be averaged include the stored digital signal.

61. The machine-readable medium of claim 59, wherein sampling the input signal comprises converting the input signal to a digital signal and filtering the digital signal based on finite impulse response, storing the sampled input signal comprises storing the filtered digital signal, and the multiple signals to be averaged include the stored and filtered digital signal.

62. The machine-readable medium of claim 58, wherein the input signal comprises a read signal received from a storage medium, interpreting the input signal comprises determining if the read signal adequately indicates the discrete values, and averaging the multiple signals comprises averaging multiple read signals of the storage medium to improve read signal interpretation.

63. The machine-readable medium of claim 58, wherein determining whether the discrete values are adequately indicated comprises interpreting the averaged signal with a Viterbi detector.

64. The machine-readable medium of claim 58, wherein averaging the multiple signals further comprises, in the retry mode, in response to the discrete values being inadequately indicated, repeatedly obtaining a new signal, averaging the new signal with the previous averaged signal, and determining if the newly averaged signal adequately indicates the discrete values.

65. A non-transitory machine-readable medium embodying information indicative of instructions for causing one or more machines to perform operations for reading data on a channel or media, the operations comprising:
 interpreting an input signal as discrete values;
 deciding whether the discrete values have been adequately interpreted from the input signal;
 entering a retry mode in response to a decision that the discrete values have not been adequately interpreted from the input signal;
 obtaining, in the retry mode, one or more second signals representing same data as the input signal;
 averaging, in the retry mode, multiple signals to improve interpretation of the input signal, wherein the averaging includes determining a weighted average based on weights, the input signal, and the one or more second signals to produce an averaged signal and to improve signal interpretation, wherein the weights correspond, respectively, to the input signal and the one or more second signals, wherein the weights are based on respective signal quality measures;
 interpreting the averaged signal as new discrete values; and
 determining whether the new discrete values are adequately indicated based on the averaged signal;
 wherein determining whether the new discrete values are adequately indicated comprises comparing interpretations of the averaged signal and of the one or more second signals.

66. The machine-readable medium of claim 65, wherein averaging the multiple signals further comprises, in the retry mode, in response to the discrete values being inadequately indicated, repeatedly obtaining a new signal, averaging most recent signals, and determining if the newly averaged signal adequately indicates the discrete values.

67. The machine-readable medium of claim 66, wherein averaging the most recent signals comprises averaging the three most recent signals.

* * * * *